(12) United States Patent
Akutsu et al.

(10) Patent No.: US 10,199,358 B2
(45) Date of Patent: Feb. 5, 2019

(54) MULTILAYER SUBSTRATE

(71) Applicant: DEXERIALS CORPORATION, Tokyo (JP)

(72) Inventors: Yasushi Akutsu, Utsunomiya (JP); Tomoyuki Ishimatsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/543,397

(22) PCT Filed: Jan. 13, 2016

(86) PCT No.: PCT/JP2016/050873
§ 371 (c)(1),
(2) Date: Jul. 13, 2017

(87) PCT Pub. No.: WO2016/114318
PCT Pub. Date: Jul. 21, 2016

(65) Prior Publication Data
US 2018/0026012 A1    Jan. 25, 2018

(30) Foreign Application Priority Data

Jan. 13, 2015   (JP) ................. 2015-004595

(51) Int. Cl.
*H01L 25/00* (2006.01)
*H01L 25/065* (2006.01)
(Continued)

(52) U.S. Cl.
CPC .......... *H01L 25/0657* (2013.01); *H01L 24/11* (2013.01); *H01L 24/13* (2013.01);
(Continued)

(58) Field of Classification Search
CPC ..... H01L 25/0657; H01L 25/50; H01L 24/11; H01L 24/16; H01L 24/27; H01L 24/32;
(Continued)

(56) References Cited

U.S. PATENT DOCUMENTS 5,688,584 A * 11/1997 Casson .................. H05K 3/323
                                                                174/259
6,147,311 A * 11/2000 Higashi ................. H01L 21/563
                                                                174/255
(Continued)

FOREIGN PATENT DOCUMENTS

JP    S62-034773 A    2/1987
JP    H03-62411 A     3/1991
(Continued)

OTHER PUBLICATIONS

Mar. 22, 2016 Search Report issued in International Patent Application No. PCT/JP2016/050873.
(Continued)

*Primary Examiner* — Ida M Soward
(74) *Attorney, Agent, or Firm* — Oliff PLC

(57) ABSTRACT

Provided is a multilayer substrate obtained by laminating semiconductor substrates each having a trough electrode. The multilayer substrate has excellent conduction characteristics and can be manufactured at low cost. Conductive particles are each selectively present at a position where the through electrodes face each other as viewed in a plan view of the multilayer substrate. The multilayer substrate has a connection structure in which the facing through electrodes are connected by the conductive particles, and the semiconductor substrates each having the through electrode are bonded by an insulating adhesive.

12 Claims, 10 Drawing Sheets

(51) Int. Cl.
*H01L 23/00* (2006.01)
*H01L 23/544* (2006.01)

(52) U.S. Cl.
CPC ............. *H01L 24/16* (2013.01); *H01L 24/17* (2013.01); *H01L 24/27* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 25/50* (2013.01); *H01L 23/544* (2013.01); *H01L 24/33* (2013.01); *H01L 2223/54426* (2013.01); *H01L 2224/111* (2013.01); *H01L 2224/11003* (2013.01); *H01L 2224/131* (2013.01); *H01L 2224/133* (2013.01); *H01L 2224/136* (2013.01); *H01L 2224/1319* (2013.01); *H01L 2224/1357* (2013.01); *H01L 2224/13078* (2013.01); *H01L 2224/13139* (2013.01); *H01L 2224/13144* (2013.01); *H01L 2224/13147* (2013.01); *H01L 2224/13155* (2013.01); *H01L 2224/13157* (2013.01); *H01L 2224/13164* (2013.01); *H01L 2224/13582* (2013.01); *H01L 2224/13644* (2013.01); *H01L 2224/13655* (2013.01); *H01L 2224/16058* (2013.01); *H01L 2224/16146* (2013.01); *H01L 2224/16227* (2013.01); *H01L 2224/16235* (2013.01); *H01L 2224/17107* (2013.01); *H01L 2224/17181* (2013.01); *H01L 2224/271* (2013.01); *H01L 2224/27003* (2013.01); *H01L 2224/27515* (2013.01); *H01L 2224/2919* (2013.01); *H01L 2224/2929* (2013.01); *H01L 2224/29387* (2013.01); *H01L 2224/32145* (2013.01); *H01L 2224/32225* (2013.01); *H01L 2224/33181* (2013.01); *H01L 2224/73104* (2013.01); *H01L 2224/73204* (2013.01); *H01L 2224/8113* (2013.01); *H01L 2224/81101* (2013.01); *H01L 2224/81122* (2013.01); *H01L 2224/81132* (2013.01); *H01L 2224/81203* (2013.01); *H01L 2224/81903* (2013.01); *H01L 2224/8313* (2013.01); *H01L 2224/83101* (2013.01); *H01L 2224/83122* (2013.01); *H01L 2224/83132* (2013.01); *H01L 2224/83203* (2013.01); *H01L 2224/83856* (2013.01); *H01L 2224/9211* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2225/06586* (2013.01); *H01L 2225/06589* (2013.01); *H01L 2924/00015* (2013.01); *H01L 2924/3841* (2013.01)

(58) Field of Classification Search
CPC ......... H01L 24/73; H01L 24/81; H01L 24/83; H01L 24/92
See application file for complete search history.

(56) References Cited

U.S. PATENT DOCUMENTS

| | | | | |
|---|---|---|---|---|
| 8,048,721 B2 * | 11/2011 | Hsu | ......................... | H01L 21/563 257/E21.503 |
| 8,097,953 B2 * | 1/2012 | Tseng | ................ | H01L 21/76898 257/774 |
| 8,334,170 B2 * | 12/2012 | Wang | ...................... | H01L 24/33 257/621 |
| 8,377,745 B2 * | 2/2013 | Shimada | ............... | H01L 21/561 257/E21.499 |
| 8,674,482 B2 * | 3/2014 | Shi | .................... | H01L 21/76898 257/621 |
| 8,801,279 B2 * | 8/2014 | Kim | ........................ | G01K 7/01 374/152 |
| 8,866,303 B2 * | 10/2014 | Kim | .................... | H01L 25/0657 257/774 |
| 8,908,345 B2 * | 12/2014 | Furuta | ..................... | H01L 23/62 257/723 |
| 9,087,571 B2 * | 7/2015 | Yoko | ......................... | G06F 1/10 |
| 9,123,554 B2 * | 9/2015 | Kuroda | ............... | H01L 25/0657 |
| 9,123,830 B2 * | 9/2015 | Nakamura | ........... | H01L 25/065 |
| 9,158,081 B2 * | 10/2015 | Jo | ............................ | G02B 6/43 |
| 9,165,916 B2 * | 10/2015 | Chung | .................... | H01L 25/50 |
| 9,349,670 B2 * | 5/2016 | Zhou | ..................... | H01L 23/3738 |
| 2010/0164090 A1 * | 7/2010 | Kim | ........................ | H01L 24/16 257/692 |
| 2012/0034759 A1 * | 2/2012 | Sakaguchi | ............ | H01L 21/563 438/458 |
| 2012/0038057 A1 * | 2/2012 | Bartley | ............... | H01L 23/3677 257/774 |
| 2012/0077314 A1 * | 3/2012 | Park | .................... | H01L 25/0657 438/109 |
| 2012/0248627 A1 * | 10/2012 | Gaul | .................... | H01L 23/3677 257/774 |
| 2013/0049223 A1 * | 2/2013 | Nomoto | .............. | H01L 25/0657 257/774 |
| 2013/0228898 A1 * | 9/2013 | Ide | ........................ | H01L 23/481 257/621 |
| 2014/0217616 A1 * | 8/2014 | Choi | ....................... | H01L 25/50 257/777 |
| 2015/0262878 A1 * | 9/2015 | Sato | ..................... | H01L 25/074 257/777 |

FOREIGN PATENT DOCUMENTS

| | | |
|---|---|---|
| JP | H08-330736 A | 12/1996 |
| JP | 2001-237365 A | 8/2001 |
| JP | 2002-110897 A | 4/2002 |
| JP | 2002110897 A * | 4/2002 |
| JP | 2006-245311 A | 9/2006 |
| JP | 2006-310082 A | 11/2006 |
| JP | 2006-339160 A | 12/2006 |
| JP | 2010-272737 A | 12/2010 |
| KR | 20060069525 A | 6/2006 |
| KR | 20070103185 A | 10/2007 |
| KR | 20090011568 A * | 2/2009 |
| WO | 03/003798 A1 | 1/2003 |

OTHER PUBLICATIONS

Mar. 22, 2016 Written Opinion (237) issued in International Patent Application No. PCT/JP2016/050873.
Jan. 31, 2017 Written Opinion (408) issued in International Patent Application No. PCT/JP2016/050873.
Apr. 13, 2017 International Preliminary Report on Patentability issued in International Patent Application No. PCT/JP2016/050873.
Aug. 19, 2018 Office Action issued in Korean Patent Application No. 10-2017-7017940.

* cited by examiner

MULTILAYER SUBSTRATE

TECHNICAL FIELD

The present invention relates to a multilayer substrate.

BACKGROUND ART

In a field of high-density packaging for an IC, a multilayer substrate obtained by laminating semiconductor substrates into which electronic parts such as ICs are incorporated is used.

Examples of the method for manufacturing a multilayer substrate may include a method in which a through electrode having a bump is formed on each semiconductor substrate and the through electrodes of the semiconductor substrates facing each other are connected by reflowing the bumps (Patent Literature 1), and a method in which an anisotropic conductive film having an insulating adhesive layer containing dispersed conductive particles is disposed between facing semiconductor substrates and pressurized under heating to connect through electrodes (Patent Literature 2).

CITATION LIST

Patent Literature

Patent Literature 1: Japanese Patent Application Laid-Open No. 2010-272737
Patent Literature 2: Japanese Patent Application Laid-Open No. Hei. 8-330736

SUMMARY OF INVENTION

Technical Problem

However, a method in which a bump is formed in a through electrode of each semiconductor substrate and the through electrodes of the semiconductor substrates facing each other are connected by reflowing with a solder to thereby laminate the semiconductor substrates has a complex manufacturing step.

In a method in which through electrodes facing each other are connected using an anisotropic conductive film to thereby laminate semiconductor substrates, a step of manufacturing a multilayer substrate can be simplified to some extent. However, the anisotropic conductive film has an insulating adhesive layer containing randomly dispersed conductive particles. Therefore, the conductive particles in the anisotropic conductive film may not be sufficiently disposed between the facing through electrodes of the semiconductor substrates. Accordingly, there is a problem such as ununiform conduction characteristics. On the other hand, there are many conduction particles which do not contribute to connection between the through electrodes, between the facing semiconductor substrates. Therefore, there is also a problem in terms of cost for unnecessary conductive particles.

An object of the present invention is to provide a multilayer substrate which includes semiconductor substrates laminated using an anisotropic conductive film and has excellent conduction characteristics by a simple manufacturing step at low cost.

Solution to Problem

The present inventor has found that when conductive particles in an insulating adhesive layer of an anisotropic conductive film are selectively disposed so as to correspond to the arrangement of through electrodes of semiconductor substrates in manufacturing of a multilayer substrate by laminating the semiconductor substrates using the anisotropic conductive film, the through electrodes of the semiconductor substrates facing each other can be certainly connected by the conductive particles, and the number of conductive particles which do not contribute to connection is decreased to decrease the manufacturing cost for the multilayer substrate. The present invention has thus been conceived.

Specifically, the present invention provides a multilayer substrate including semiconductor substrates which each have a through electrode and are laminated to each other, wherein conductive particles are each selectively present at a position where the through electrodes face each other as viewed in a plan view of the multilayer substrate, and the multilayer substrate has a connection structure in which the facing through electrodes are connected by the conductive particles, and the semiconductor substrates each having the through electrode are bonded together by an insulating adhesive.

In particular, the present invention provides as an aspect a multilayer substrate including a first semiconductor substrate having a through electrode and a second semiconductor substrate having a through electrode, the first and second semiconductor substrates being laminated together, the multilayer substrate having a connection structure in which the through electrode of the first semiconductor substrate and the through electrode of the second semiconductor substrate face each other, and are connected by conductive particle which is selectively disposed between the through electrodes, and the first and second semiconductor substrates are bonded together by an insulating adhesive.

The present invention provides a method for manufacturing a multilayer substrate in which through electrodes formed in semiconductor substrates are faced and joined each other. The method includes: putting between the semiconductor substrates each having the through electrode an anisotropic conductive film in which conductive particles are selectively disposed in an insulating adhesive layer so as to each correspond to a position where the through electrodes face each other as viewed in a plan view of the multilayer substrate; and pressurizing the anisotropic conductive film under heating to achieve anisotropic conductive connection of the semiconductor substrates.

In particular, the present invention provides as an aspect a method for manufacturing a multilayer substrate in which a through electrode of a first semiconductor substrate having the through electrode and a through electrode of a second semiconductor substrate having the through electrode are faced and joined each other. The method includes: putting between the first and second semiconductor substrates an anisotropic conductive film in which conductive particles are selectively disposed in an insulating adhesive layer so as to correspond to the arrangement of the through electrodes; and pressurizing the anisotropic conductive film under heating to achieve anisotropic conductive connection of the first and second semiconductor substrates.

Further, as the anisotropic conductive film used in the method for manufacturing a multilayer substrate described above, the present invention provides an anisotropic conductive film including an insulating adhesive layer and conductive particles disposed in the insulating adhesive layer, wherein the conductive particles are selectively disposed in the insulating adhesive layer so as to correspond to the arrangement of through electrodes connected by the anisotropic conductive film.

Moreover, as an anisotropic conductive film useful in the method for manufacturing a multilayer substrate described above, the present invention provides an anisotropic conductive film including an insulating adhesive layer and conductive particles disposed in the insulating adhesive layer. In the anisotropic conductive film, a conductive particle unit including two or more adjacent conductive particles is formed. In the conductive particle unit, a distance between any conductive particle and a conductive particle closest to the conductive particle is 0.2 to 0.5 times the particle diameter of the conductive particles.

Advantageous Effects of Invention

According to the multilayer substrate of the present invention, through electrodes of semiconductor substrates are certainly connected by conductive particles. Therefore, conduction characteristics are stable. Since the number of conductive particles which do not contribute to connection is decreased between the semiconductor substrates, the manufacturing cost for the multilayer substrate is suppressed. For the same reason, the present invention is also effective in a decrease in number of instrumentation steps.

When an anisotropic conductive film in which conductive particles are each selectively disposed at a specific position is used, the multilayer substrate of the present invention can be manufactured by a simple step.

In particular, when a multilayer substrate having three or more semiconductor substrates laminated is manufactured by the method of the present invention, a common anisotropic conductive film is used between the laminated semiconductor substrates, whereby the total manufacturing cost for the multilayer substrate can be largely decreased. Therefore, the multilayer substrate of the present invention can be provided at low cost.

DESCRIPTION OF EMBODIMENTS

Figure 1:
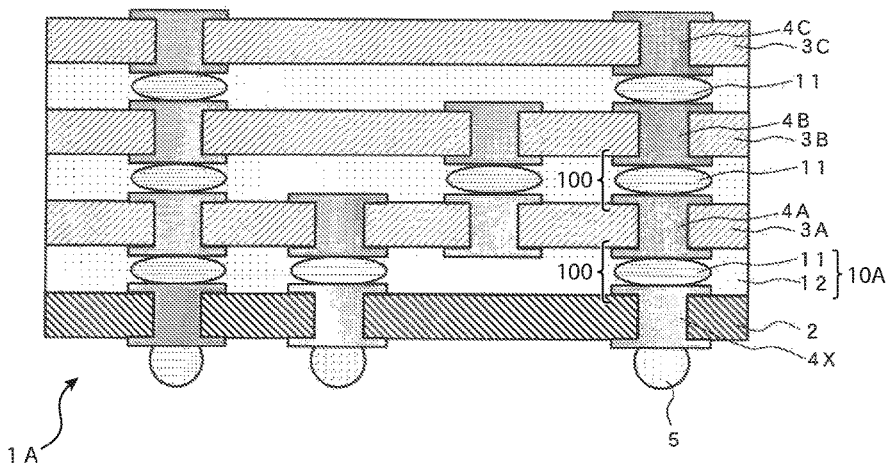
FIG. 1 is a cross-sectional view of a multilayer substrate 1A of an embodiment of the present invention.

Hereinafter, the present invention will be described in detail with reference to the drawings. In the drawings, the same reference numerals denote the same or similar components.

<Connection Structure in Multilayer Substrate>

FIG. 1 is a cross-sectional view of a multilayer substrate 1A of an embodiment of the present invention.

In this multilayer substrate 1A, three semiconductor substrates 3A, 3B, and 3C are laminated on a wiring substrate 2. The semiconductor substrates 3A, 3B, and 3C are each a semiconductor wafer in which a semiconductor part such as an IC is formed. In the wiring substrate 2, a through electrode 4X is formed. In the semiconductor substrates 3A, 3B, and 3C, through electrodes 4A, 4B, and 4C are formed, respectively. In a part where the through electrode 4X is exposed to the surface of the wiring substrate 2 and parts where the through electrodes 4A, 4B, and 4C are exposed to the surface of the semiconductor substrates, electrode pads are formed respectively. In the present invention, as the semiconductor substrates 3A, 3B, and 3C, a semiconductor chip may be used. In the present invention, the number of the semiconductor substrates constituting the multilayer substrate which are laminated is not particularly limited.

The multilayer substrate 1A has a connection structure 100 in which the through electrodes 4X of the wiring substrate 2 and the through electrodes 4A of the first semiconductor substrate 3A face each other and are electrically connected by conductive particles 11 which are each selectively disposed between the through electrodes 4X and 4A. The multilayer substrate 1A also has a connection structure 100 in which the through electrodes 4A of the first semiconductor substrates 3A and the through electrode 4B of the second semiconductor substrate 3B face each other and are electrically connected by the conductive particles 11 which are selectively disposed between the through electrodes 4A and 4B.

The conductive particles 11 which are each selectively disposed at a part where the through electrodes 4A and 4B face each other in this connection structure means that the conductive particles 11 are mainly present on facing surfaces of the through electrodes 4A and 4B or in the vicinity of the surfaces and are captured by the facing surfaces of the through electrodes 4A and 4B so that the number of the captured conductive particles 11 is one or more. It is preferable that one to several conductive particles be captured by the facing surfaces of the through electrodes 4A and 4B in terms of cost. When a plurality of conductive particles are disposed on the facing surfaces of the through electrodes 4A and 4B using the anisotropic conductive film, precision for positioning the semiconductor substrates 3A and 3B and the conductive particles 11 can be moderated. On the other hand, it is preferable that 10 or more conductive particles be captured by the facing surfaces of the through electrodes 4A and 4B in terms of conduction stability. In order to capture the conductive particles more stably when the conductive particles are disposed on the facing surfaces of the through electrodes 4A and 4B using the anisotropic conductive film, the conductive particles may be disposed at a corresponding position of the anisotropic conductive film so that the number of the conductive particles is one time to several times the expected number of conductive particles to be captured by the facing surfaces of the through electrodes 4A and 4B. Thus, the precision for positioning can be moderated, and an effect of decreasing the time required for manufacturing of the semiconductor substrate can also be expected.

The facing surfaces of the first semiconductor substrate 3A and the second semiconductor substrate 3B are bonded by an insulating adhesive 12. The insulating adhesive 12 is formed from an insulating adhesive layer of an anisotropic conductive film 10A described below.

The through electrode 4B of the second semiconductor substrate 3B which is connected to the through electrode 4A of the first semiconductor substrate 3A, on the side of the third semiconductor substrate 3C, also faces the through electrode 4C of the third semiconductor substrate 3C. The through electrode 4B of the second semiconductor substrate 3B and the through electrode 4C of the third semiconductor substrate 3C are electrically connected by the conductive particles 11 which are each selectively disposed between the through electrodes. The facing surfaces of the second semiconductor substrate 3B and the third semiconductor substrate 3C are also bonded by the insulating adhesive 12.

As described above, the multilayer substrate 1A has a connection structure in which the through electrode 4X of the wiring substrate 2 and the through electrodes 4A, 4B, and 4C of the three semiconductor substrates are connected linearly in a lamination direction of the multilayer substrate. According to the connection structure in which the linear connection is formed in the lamination direction of the multilayer substrate, an electrical transmission path is shortened. Therefore, the transmission speed can be improved.

<Conductive Particles in Multilayer Substrate>

The multilayer substrate 1A is manufactured by connecting layers constituting the multilayer substrate using the anisotropic conductive film of the present invention which includes conductive particles in a specific arrangement, as described below. The particle diameter of the conductive particles 11 in the anisotropic conductive film is usually smaller than the diameter of the facing surfaces of the through electrodes 4A and 4B. However, in the multilayer substrate 1A, the particle diameter may be substantially the same as the diameter of the facing surfaces of the through electrodes 4A and 4B. This is because the shape of the conductive particles 11 is crushed as compared with the original shape. This means that the conductive particles 11 having a crushed shape may be put within the facing surfaces of the through electrodes 4A and 4B and at least part of circumference of the conductive particles may be protruded from the facing surfaces of the through electrodes 4A and 4B. Although the particle shape of the conductive particles 11 depends on a material for the conductive particles 11, the particle shape may also be maintained in the multilayer substrate 1A.

Between the first semiconductor substrate 3A and the second semiconductor substrate 3B of the multilayer substrate 1A, the conductive particles 11 are each selectively present at a part where the through electrodes 4A and 4B face each other as described above, and most of the conductive particles 11 is captured by the facing through electrodes 4A and 4B. Therefore, although some conductive particles 11 may not be captured by the facing through electrodes 4A and 4B, the number of such conductive particles 11 is preferably 5% or less, and more preferably 0.5% or less, relative to the total number of the conductive particles present between the first semiconductor substrate 3A and the second semiconductor substrate 3B. In particular, it is preferable that substantially all of the conductive particles 11 be captured by the through electrodes 4A and 4B. This also applies to relations between other semiconductor substrates constituting the multilayer substrate 1A. When the number of conductive particles 11 which do not contribute to connection between the through electrodes 4A, 4B, and 4C is decreased, simulation analysis of performance is facilitated, and the number of improvement step can be decreased.

<Wiring Substrate>

As the wiring substrate 2 constituting the multilayer substrate 1A, a glass epoxy substrate such as FR4 can be used herein. As the wiring substrate 2, an IC chip or a silicon wafer for forming an IC may be used.

The wiring substrate 2 is appropriately selected depending on applications of the multilayer substrate 1A.

On an electrode part of the wiring substrate 2, a solder ball 5 may be provided, if necessary.

<Semiconductor Substrate>

The semiconductor substrates 3A, 3B, and 3C are not particularly limited as long as they have the through electrodes 4A, 4B, and 4C. For example, a general semiconductor material such as silicon can be used.

The specifications of the through electrodes 4A, 4B, and 4C can be appropriately set. For example, the through electrodes 4A, 4B, and 4C may have an electrode pad or a bump. When the semiconductor substrates 3A, 3B, and 3C are laminated, the through electrodes 4A, 4B, and 4C which are disposed so that the through electrodes 4A, 4B, and 4C of the semiconductor substrates 3A, 3B, and 3C, respectively, are linearly connected in the thickness direction of the multilayer substrate 1A over at least two semiconductor substrates, and are preferably linearly connected from the front surface to the back surface of the multilayer substrate 1A are used.

<Mounted Part>

On the multilayer substrate of the present invention, various parts can be mounted, if necessary.

Figure 2:
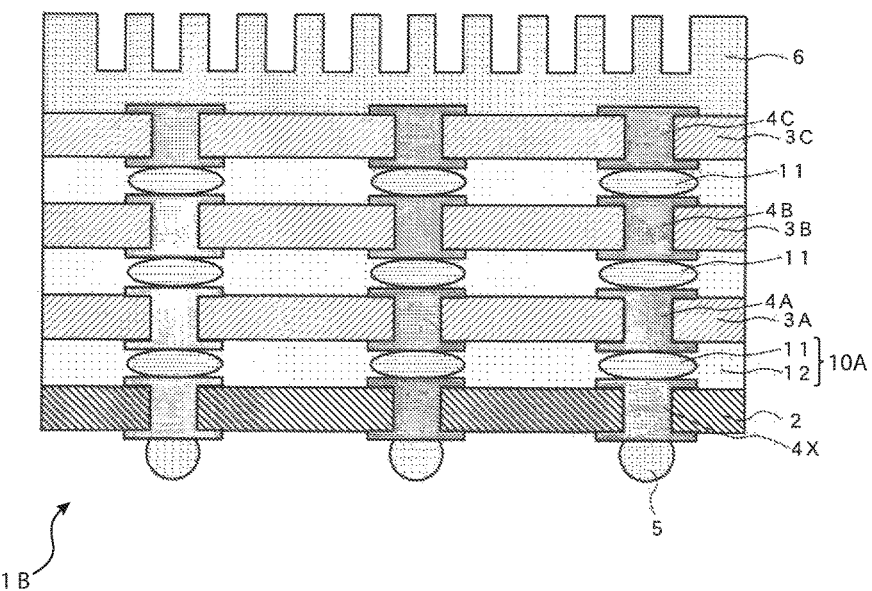
FIG. 2 is a cross-sectional view of a multilayer substrate 1B of an embodiment of the present invention.

For example, a multilayer substrate 1B shown in FIG. 2 has a connection structure in which the through electrodes 4X, 4A, 4B, and 4C of the layers are linearly connected, and has a heat sink 6 for heat dissipation which is connected to the through electrode 4C in the outermost layer. Therefore, in the multilayer substrate 1B, heat emitted from electronic parts, such as an IC, formed in the wiring substrate 2 and the semiconductor substrates 3A, 3B, and 3C can be efficiently dissipated by the heat sink 6.

<Method for Manufacturing Multilayer Substrate>

Figure 3A:
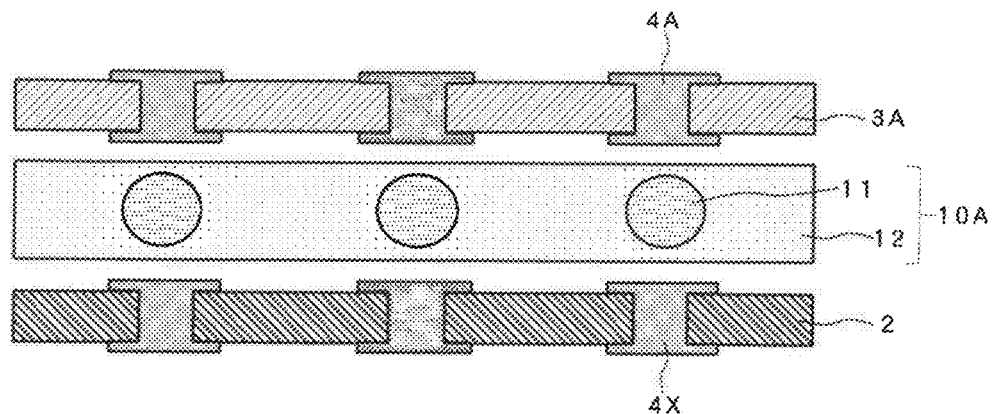
FIG. 3A is a view illustrating a step of manufacturing the multilayer substrate 1B.
Figure 3B:
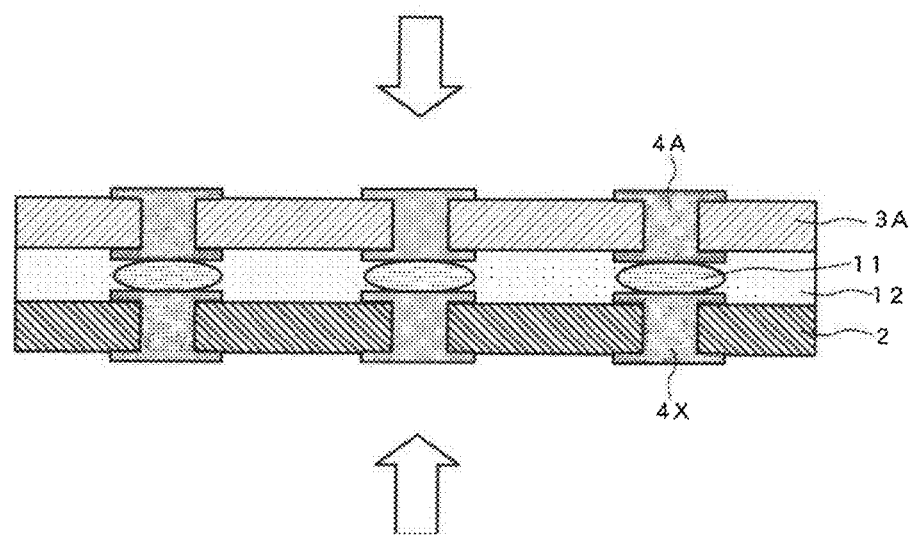
FIG. 3B is a view illustrating a step of manufacturing the multilayer substrate 1B.

In a case of the multilayer substrate 1B shown in FIG. 2, according to the method for manufacturing a multilayer substrate of the present invention, an anisotropic conductive film 10A of the present invention in which the conductive particles 11 are selectively disposed in the insulating adhesive layer 12 so as to correspond to the arrangement of the through electrodes 4X and 4A to be connected is first put between the wiring substrate 2 having the through electrode 4X and the semiconductor substrate 3A having the through electrode 4A, as shown in FIG. 3A. The anisotropic conductive film 10A is then pressurized under heating, to achieve anisotropic conductive connection between the wiring substrate 2 and the first semiconductor substrate 3A. Thus, a connection structure of two layers, as shown in FIG. 3B, is obtained. More specifically, the wiring substrate 2 and the anisotropic conductive film 10A are positioned and laminated so that the arrangement of the through electrode 4X to be connected is matched to that of the conductive particles 11. Subsequently, the first semiconductor substrate 3A is also positioned and laminated in the same manner. The wiring substrate 2 and the first semiconductor substrate 3A are pressurized under heating, to achieve anisotropic conductive connection between them.

Figure 3C:
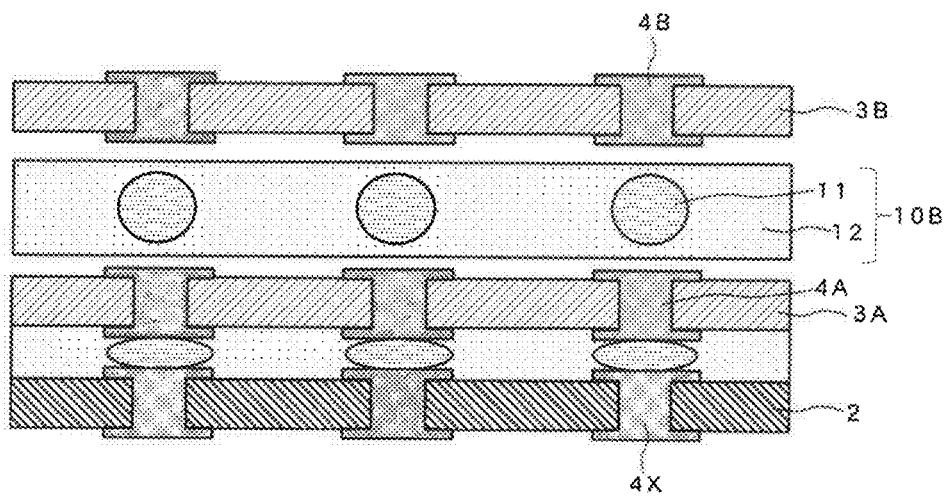
FIG. 3C is a view illustrating a step of manufacturing the multilayer substrate 1B.
Figure 3D:
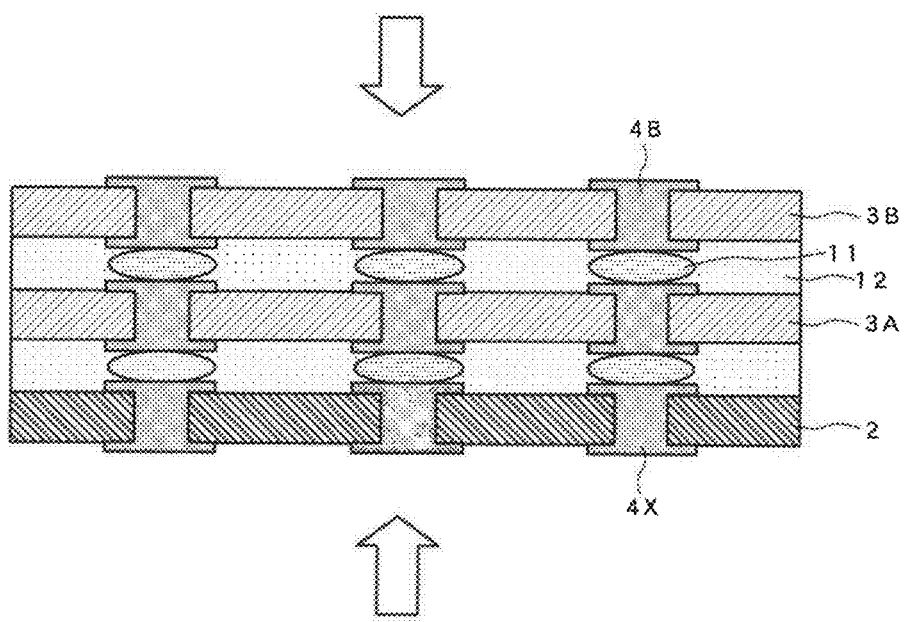
FIG. 3D is a view illustrating a step of manufacturing the multilayer substrate 1B.

As shown in FIG. 3C, the first semiconductor substrate 3A and an anisotropic conductive film 10B are positioned and laminated in the same manner, the second semiconductor substrate 3B is positioned and laminated on them, and the first semiconductor substrate 3A and the second semiconductor substrate 3B are pressurized under heating, to achieve anisotropic conductive connection between them. Thus, a connection structure of three layers, as shown in FIG. 3D, is obtained. Further, an anisotropic conductive film and the third semiconductor substrate 3C are positioned and laminated on the second semiconductor substrate 3B, followed by pressurizing under heating, in the same manner. The positioning may be performed by observing the conductive particles in the anisotropic conductive film which correspond to the through electrode (when a conductive particle unit is formed as described below, conductive particles constituting the conductive particle unit are used) and the through electrodes by a CCD or the like and laminating them.

Subsequently, the heat sink 6 is connected to the third semiconductor substrate 3C through a thermally conductive tape or the like, and the solder ball 5 is formed on the electrode pad of the wiring substrate 2. Thus, the multilayer substrate 1B is obtained by an ordinary method. Alternatively, the conductive particle may be provided instead of the solder ball 5.

As a method of positioning the wiring substrate 2 or the semiconductor substrates 3A, 3B, and 3C with the anisotropic conductive film 10A or 10B, positioning can be performed by making an alignment mark on each of the wiring substrate 2, the semiconductor substrates 3A, 3B, and 3C, and the anisotropic conductive film 10A or 10B and matching the alignment marks.

Specifically, when the multilayer substrate is conventionally manufactured by laminating the semiconductor substrates, an alignment mark with a size of several tens μm to several hundreds μm is formed on the semiconductor substrates as one example, and the semiconductor substrates are positioned relative to each other using a CCD or a laser. Since the conductive particles in the anisotropic conductive film are disposed in a monodispersed system or in a lattice, the anisotropic conductive film does not need an alignment mark. However, in the anisotropic conductive film used in the present invention, the conductive particles 11 are selectively disposed in the insulating adhesive layer 12 so as to correspond to the arrangement of the through electrodes to be connected. Therefore, the arrangement of the conductive particles 11 can be used in place of the alignment mark. It is preferable that any alignment mark be made on the anisotropic conductive film in addition to the arrangement of the conductive particles.

<Anisotropic Conductive Film>

The anisotropic conductive film of the present invention used in the method for manufacturing a multilayer substrate of the present invention is one in which the conductive particles 11 are selectively disposed in the insulating adhesive layer 12 so as to correspond to the arrangement of the through electrodes to be connected, and the alignment mark is preferably formed by the conductive particles 11. It is preferable that the alignment mark be formed by the arrangement of the conductive particles. Thus, the alignment mark can be clearly detected, and addition of a new step of making the alignment mark on the anisotropic conductive film is unnecessary. On the other hand, the alignment mark may be formed by partially curing the insulating adhesive layer 12 by laser irradiation or the like. Therefore, the position where the alignment mark is made is easily changed.

A method for manufacturing such an anisotropic conductive film is performed as follows. A die having a convex portion in an arrangement corresponding to the arrangement of the conductive particles 11 is produced by processing a metal plate by a known processing method such as machining, laser processing, or photolithography. The die is filled with a curable resin. The curable resin is cured, to manufacture a resin mold with inverted concave and convex portions. The conductive particles are put into the concave portion of the resin mold, and a composition for forming an insulating adhesive layer is placed in the resin mold from above the conductive particles, and cured, and the cured product is then taken from the mold.

Alternatively, in order to dispose the conductive particles 11 in the insulating adhesive layer 12 in the predetermined arrangement, a method in which a member having penetrating holes in a predetermined arrangement is provided on a layer of a composition for forming an insulating adhesive layer, and the conductive particles 11 are supplied over the member and passed through the penetrating hole may be used.

<Conductive Particles Forming Anisotropic Conductive Film>

The conductive particles used to form the anisotropic conductive films 10A and 10B can be appropriately selected from conductive particles used in a known anisotropic conductive film. Examples thereof may include particles of metals such as solder, nickel, cobalt, silver, copper, gold, and palladium, and metal-coated resin particles. The metal coating of the metal-coated resin particles can be formed using a known metal film forming method such as an electroless plating method or a sputtering method. The metal coating is not particularly limited as long as it is formed on a surface of a core resin material. The core resin material may be formed from only a resin. In order to improve conduction reliability, the core resin material may contain conductive fine particles.

Among the particles described above, it is preferable that as the conductive particles, solder particles be used in terms of conduction reliability and cost. On the other hand, when a reflowing step is unnecessary at a downstream step, it is preferable that the metal-coated resin particles be used. In the present invention, connection between the through electrodes and bonding between the semiconductor substrates are performed by pressurizing the anisotropic conductive film, in which the conductive particles are disposed in the insulating adhesive layer, under heating. Therefore, when the metal-coated resin particles are used as the conductive particles, pressurizing under heating can be performed at lower temperature. Accordingly, the range of selected material for an insulating adhesive can be expanded.

As the conductive particles, two or more types of particles may be used in combination.

The particle diameter of the conductive particles 11 is preferably 2 to 40 μm, in terms of stability of junction between electrodes.

<Insulating Adhesive Layer Forming Anisotropic Conductive Film>

As the insulating adhesive layer 12, an insulating resin layer used in a publicly known anisotropic conductive film can be appropriately adopted. For example, a photoradically polymerizable resin layer containing an acrylate compound and a photoradical polymerization initiator, a thermo-radically polymerizable resin layer containing an acrylate compound and a thermo-radical polymerization initiator, a thermo-cationically polymerizable resin layer containing an epoxy compound and a thermo-cationic polymerization initiator, a thermo-anionically polymerizable resin layer containing an epoxy compound and a thermo-anionic polymerization initiator, or the like, can be used. The resin layers may be resin layers obtained by polymerization, if necessary. Further, the insulating adhesive layer 12 may be formed from a plurality of resin layers.

When the multilayer substrate 1A is cut after manufacturing of the multilayer substrate 1A depending on applications such as cutting from the multilayer substrate 1A into a chip, it is preferable that the insulating adhesive layer 12 have flexibility and adhesion which are resistance to cutting.

To the insulating adhesive layer 12, an insulating filler such as a silica fine particle, alumina, or aluminum hydroxide, may be added, if necessary. The amount of the insulating filler to be added is preferably 3 to 40 parts by mass relative to 100 parts by mass of resin forming the insulating adhesive layer. In this case, even when the insulating adhesive layer 12 is molten during anisotropic conductive connection, unnecessary movement of the conductive particles 11 by the molten resin can be suppressed.

The size of the insulating fillers is desirably a size that does not inhibit the anisotropic conductive connection.

In the anisotropic conductive films 10A and 10B thus manufactured, almost no conductive particle is present at a position other than the predetermined position. Among conductive particles present at the predetermined position, there may be a conductive particle which is not captured by the facing through electrodes 4A and 4B. Therefore, the number of the conductive particles 11 which are not captured by the through electrodes 4A and 4B between facing semiconductor substrates 3A and 3B after connection between the semiconductor substrates 3A and 3B using the anisotropic conductive film 10A or 10B is preferably 5% or less relative to the total number of the conductive particles 11 present between the facing semiconductor substrates 3A and 3B.

Modified Embodiment 1

The multilayer substrate of the present invention may have various embodiments.

Figure 4:
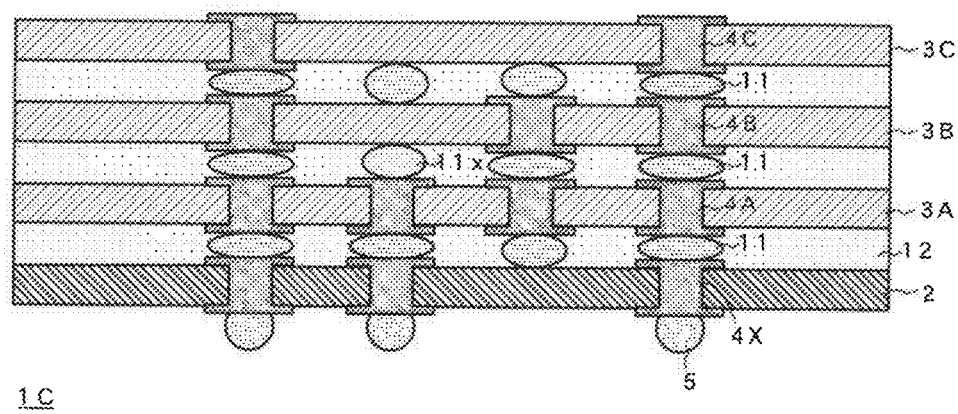
FIG. 4 is a cross-sectional view of a multilayer substrate 1C.

For example, a multilayer substrate 1C shown in FIG. 4 is manufactured using a common anisotropic conductive film as the anisotropic conductive film which connects the through electrodes 4X of the wiring substrate 2 to the through electrodes 4A of the first semiconductor substrate 3A, the anisotropic conductive film which connects the through electrodes 4A of the first semiconductor substrate 3A to the through electrodes 4B of the second semiconductor substrate 3B, and the anisotropic conductive film which connects the through electrodes 4B of the second semiconductor substrate 3B to the through electrodes 4C of the third semiconductor substrate 3C in the multilayer substrate 1A shown in FIG. 1. Specifically, as the anisotropic conductive films, an anisotropic conductive film is used in which the conductive particles 11 are each selectively disposed in the insulating adhesive layer 12 so as to correspond to a position where the through electrodes of the wiring substrate 2 and the semiconductor substrates 3A, 3B, and 3C face each other as viewed in a plan view of the multilayer substrate 1C to be manufactured. Therefore, the conductive particles 11 and 11x are present at positions where the through electrodes 4X, 4A, 4B, and 4C face each other as viewed in a plan view of the multilayer substrate 1C. Specifically, there is not necessarily a conductive particle which is selectively disposed relative to only the through electrodes between the facing through electrodes. For example, between the semiconductor substrates 3A and 3B, the conductive particles 11 are selectively disposed at positions where the through electrodes 4A and 4B formed in the semiconductor substrates 3A and 3B face each other, and in addition, the conductive particle 11x which does not contribute to connection between the through electrode 4A of the semiconductor substrate 3A and the through electrode 4B of the semiconductor substrate 3B is also present. Therefore, the conductive particle which is not captured by the through electrodes between the semiconductor substrates 3A and 3B may be present at a ratio of more than 5% relative to all the conductive particles present between the semiconductor substrates 3A and 3B. However, the conductive particle 11x which is present between the semiconductor substrates 3A and 3B and does not contribute to connection between the semiconductor substrates 3A and 3B contributes to connection between the through electrode 4X of the wiring substrate 2 and the through electrode 4A of the first semiconductor substrate 3A. The conductive particle is not disposed or is not substantially present at a position where the through electrodes do not face each other as viewed in a plan view of the multilayer substrate 1C. Specifically, in the multilayer substrate 1C shown in FIG. 4, it is preferable that the conductive particle be present at a position where the conductive particle and all the through electrodes are overlapped in a vertical direction between the semiconductor substrates at any cross section in a film thickness direction of the multilayer substrate.

When the respective semiconductor substrates are connected using the common anisotropic conductive film, as described above, the total cost for manufacturing of the multilayer substrate can be decreased. This can be easily applied to an increase in lineup of the multilayer substrate (change in specification).

As described above, in the multilayer substrate of the present invention, the conductive particles are selectively present at a position where the through electrodes face each other as viewed in a plan view of the multilayer substrate. The facing through electrodes are connected by the conductive particles disposed as described above, and the semiconductor substrates each having the through electrode are bonded together by the insulating adhesive. In this case, the facing through electrodes may be connected by the conductive particles 11 which are each selectively disposed only between the facing through electrodes, as shown in FIG. 1. The conductive particle 11x which does not contribute to connection between the facing through electrodes may be present between the semiconductor substrates having the facing through electrodes, as shown in FIG. 4.

Modified Embodiment 2

Figure 5A:
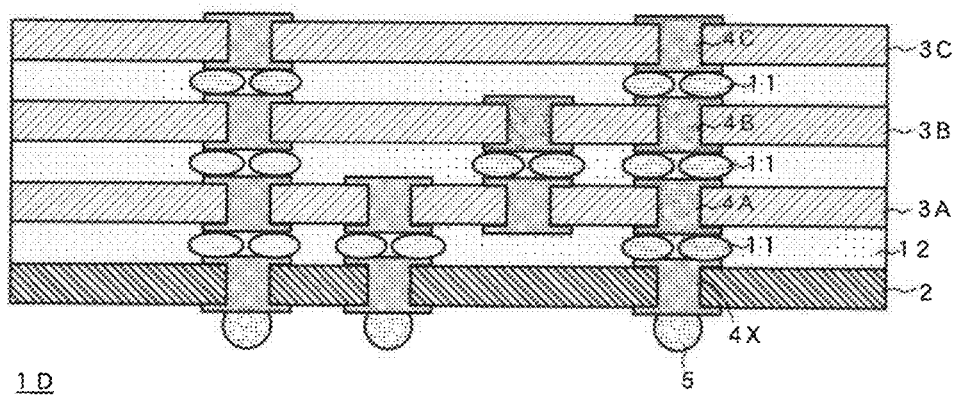
FIG. 5A is a cross-sectional view of a multilayer substrate 1D.
Figure 5B:
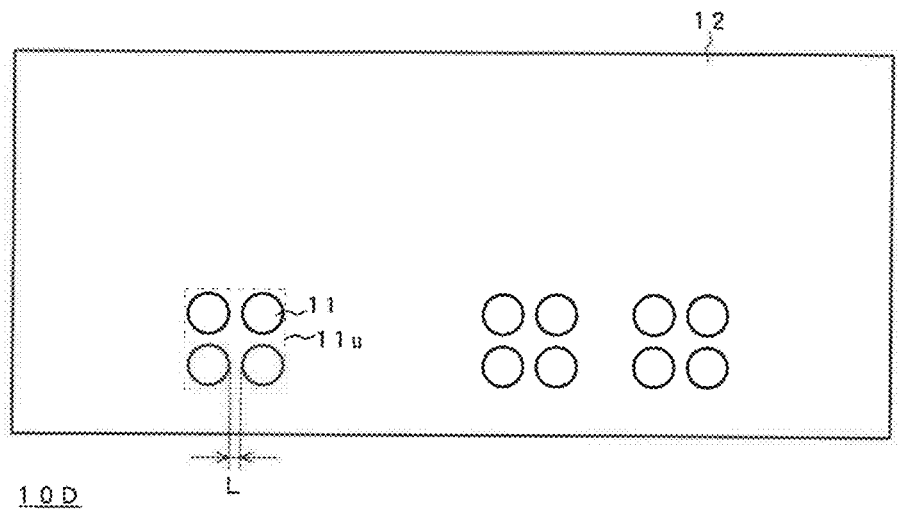
FIG. 5B is an arrangement view (plan view) of conductive particles in an anisotropic conductive film 10D used in manufacturing of the multilayer substrate 1D.

A multilayer substrate 1D shown in FIG. 5A is a multilayer substrate in which the facing through electrodes 4X, 4A, 4B, and 4C are each connected by two or more conductive particles 11 in the multilayer substrate 1A shown in FIG. 1. FIG. 5B is a plan view showing the arrangement of the conductive particles 11 in an anisotropic conductive film 10D used in this type of connection.

In the anisotropic conductive film 10D, a conductive particle unit 11u in which two or more conductive particles 4 are adjacently disposed in the insulating adhesive layer 12 is formed. Each of the conductive particle units 11 is preferably disposed so as to correspond to the arrangement of the through electrodes to be connected by the anisotropic conductive film 10D. The facing through electrodes are connected by the plurality of conductive particles 11 constituting the conductive particle unit 11u. When the facing through electrodes are connected by the plurality of conductive particles 11 constituting the conductive particle unit 11u, the conduction resistance after connection can be made more robust as compared with a case where each conductive particle is used in each connection.

In the anisotropic conductive film, the number of conductive particles constituting the conductive particle unit 11u is two or more, and preferably three or more from the viewpoint of conduction stability. When the conductive particles are present not only in the electrode surfaces of the facing through electrodes but also on the circumferences of the electrodes during anisotropic conductive connection, the allowable range of shifting of bonding the film can be expanded. Therefore, the number of conductive particles constituting the conductive particle unit 11u is preferably 30 or less, and more preferably 20 or less.

In order to easily capture a plurality of conductive particles at a part where the through electrodes face each other, the distance L between any conductive particle in the conductive particle unit 11u and another conductive particles closest to the conductive particle in the conductive particle unit 11u is preferably less than 0.5 times the particle diameter of the conductive particles. The adjacent conductive particles may be in contact with each other. In order to prevent the arrangement of the conductive particles from shifting from a desired position by interference of the conductive particles 11 which are more crushed during anisotropic conductive connection, it is preferable that the adjacent conductive particles in the conductive particle unit 11u be apart from each other at a distance which is 0.2 or more times the particle diameter of the conductive particles.

Modified Embodiment 3

When the semiconductor substrates are each connected using a common anisotropic conductive film to decrease the total cost for manufacturing of multilayer substrate, a multilayer substrate may be manufactured using an anisotropic conductive film in which the conductive particle units 11u are disposed over a surface. In this case, the number of conductive particles constituting each conductive particle unit 11u is 3 or more, preferably 12 or more, and more preferably 20 or more. The conductive particles in each conductive particle unit are not arranged in a line, but are arranged in a planar manner. The distance between the conductive particle unit 11u and the next conductive particle unit 11u is one or more times the particle diameter of the conductive particles to avoid occurrence of short circuit. The distance is appropriately set depending on an electrode interval of the semiconductor substrate. When the ratio of the diameter or the length of longest side of the conductive particle unit to the diameter or the length of longest side of the electrode is too small, the capturing properties of conductive particle by the electrode become low. When the ratio is too large, short circuit may occur. The lower limit thereof is preferably 0.3 times or more, more preferably 0.5 times or more, and further preferably 0.7 times or more. The upper limit thereof is preferably 3 times or less, and more preferably 2 times or less. When the ratio of the diameter or the length of longest side of the conductive particle unit to the diameter or the length of longest side of the electrode is less than 1, the conductive particle unit is put within the electrode. Therefore, a state where the conductive particles are interposed and held is likely to be made favorable. When the ratio is 1 or more, a margin for positioning of the conductive particles and the electrodes is increased. Therefore, the time of manufacturing the multilayer substrate may be shortened.

When the anisotropic conductive film in which the conductive particle units 11u are disposed at appropriate intervals over a surface is commonly used, the manufacturing cost for the multilayer substrate can be largely decreased as compared with the case of using an anisotropic conductive film in which the arrangement of conductive particles is changed depending on the semiconductor substrates to be connected. The present invention also includes such an anisotropic conductive film and a multilayer substrate using this film.

The multilayer substrate of the present invention can be used in various applications of various types of semiconductors required for high-density packaging, including a high-density semiconductor package. The multilayer substrate may be cut into a predetermined size for use.

EXAMPLES

Hereinafter, the present invention will be described specifically with reference to Examples.

Examples 1 to 3 and Comparative Example 1

(1) Semiconductor Substrate

Figure 6:
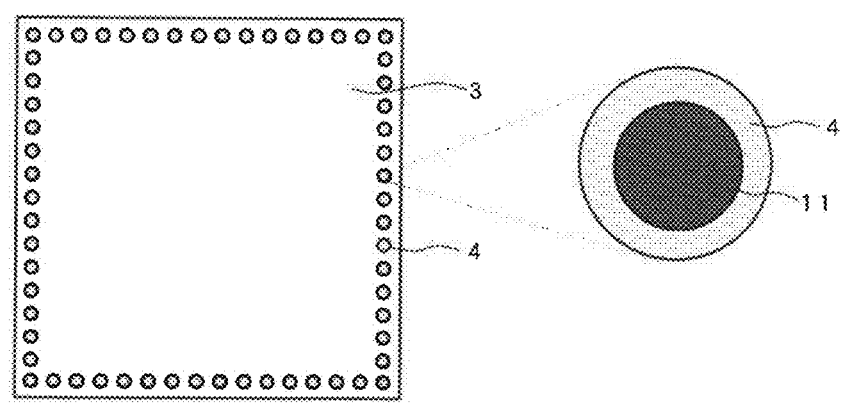
FIG. 6 is an arrangement view of electrodes and conductive particles in a surface of a semiconductor substrate used in manufacturing of a multilayer substrate of Example 1.

As a semiconductor substrate 3 constituting a multilayer substrate, a semiconductor substrate which had a rectangle with a 7-mm square outline and a thickness of 200 μm and had through electrodes 4 having a chromium electrode pad in a peripheral arrangement (diameter: 30 μm, pitch: 85 μm, 280 pins), as shown in FIG. 6, was prepared. In the semiconductor substrate, a 200-μm square mark was formed as an alignment mark.

(2) Manufacturing of Anisotropic Conductive Film

Anisotropic conductive films having conductive particles having a predetermined particle diameter as shown in Table 1 (fine solder powder, MITSUI MINING & SMELTING CO., LTD.) were manufactured by randomly disposing the conductive particles in an insulating adhesive layer (in Comparative Example 1, particle density: 17.1 particles/$mm^2$) or disposing the conductive particles so as to correspond to the arrangement of electrodes of a semiconductor substrate (in Examples 1 to 3, pitch: 85 μm, 280 positions).

Figure 7:
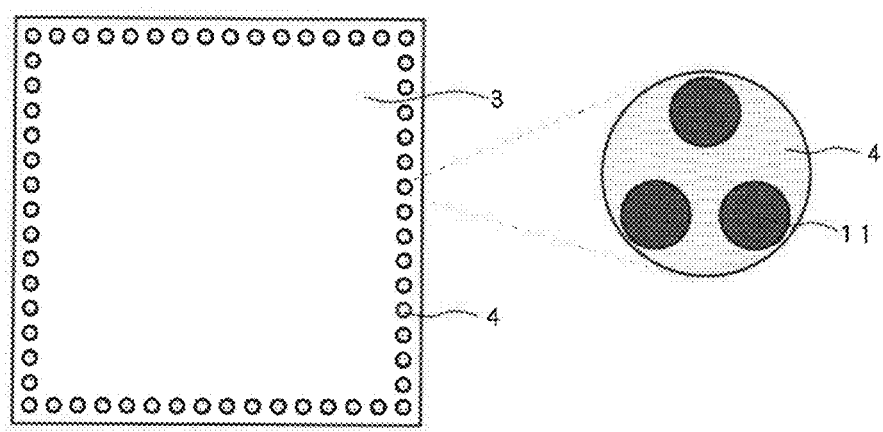
FIG. 7 is an arrangement view of electrodes and conductive particles in a surface of a semiconductor substrate used in manufacturing of a multilayer substrate of Example 3.

In Examples 1 and 2, each conductive particle 11 was disposed in each through electrode 4, as shown in FIG. 6. In Example 3, three conductive particles 11 were disposed in each through electrode 4, as shown in FIG. 7.

In Examples 1 to 3, an alignment mark was formed by the arrangement of the conductive particles. In this case, the outline of arrangement of the conductive particles was substantially matched with the outline of alignment mark of the semiconductor substrate.

More specifically, a nickel plate having a thickness of 2 mm was prepared, and a transfer master was produced by patterning so that a convex portion (diameter: 25 μm, height: 20 μm) was disposed in the arrangement of the electrodes described above. To the transfer master, a photopolymerizable resin composition containing 60 parts by mass of a phenoxy resin (YP-50, NIPPON STEEL & SUMIKIN CHEMICAL CO., LTD.), 29 parts by mass of an acrylate resin (M208, TOAGOSEI CO., LTD.), and 2 parts by mass of a photopolymerization initiator (IRGACURE184, BASF Japan Ltd.) was applied so that the dry thickness was 30 μm, dried at 80° C. for 5 minutes, and irradiated with light with 1,000 mJ by a high-pressure mercury lamp. Thus, a transfer mold having a concave portion was prepared.

A composition for forming an insulating adhesive was prepared from 60 parts by mass of a phenoxy resin (YP-50, NIPPON STEEL & SUMIKIN CHEMICAL CO., LTD.), 40 parts by mass of an epoxy resin (jER828, Mitsubishi Chemical Corporation), and 2 parts by mass of a cationic curing agent (SI-60L, SANSHIN CHEMICAL INDUSTRY CO., LTD.). This composition was applied to a PET film having a thickness of 50 μm, and dried in an oven of 80° C. for 5 minutes, to form an adhesive layer of the insulating resin having a thickness of 5 μm on the PET film.

The transfer mold having a concave portion described above was filled with conductive particles, and was coated with the adhesive layer of the insulating resin above-mentioned. A curable resin contained in the insulating resin was cured by irradiation with ultraviolet rays. The insulating resin was separated from the mold, and the insulating resin and an insulating resin layer (thickness: 15 μm) produced similarly to the adhesive layer were laminated at 60° C. and 0.5 MPa, to manufacture an anisotropic conductive film of each Example.

The anisotropic conductive film in Comparative Example 1 in which the conductive particles were randomly dispersed was manufactured by stirring the conductive particles and the insulating resin by a planetary centrifugal mixer (Thinky Corporation) to obtain a dispersion of the conductive particles, and forming a coating film of the dispersion so as to have a thickness of 20 μm.

(3) Manufacturing of Multilayer Substrate

The semiconductor substrates prepared in (1) were laminated using the anisotropic conductive film manufactured in (2) so that the number of semiconductor substrates laminated was the number shown in Table 1, and pressurized under heating (180° C., 40 MPa, 20 seconds) to manufacture a multilayer substrate.

(4) Evaluation

For the obtained multilayer substrates, (a) conduction resistance, (b) conduction reliability, and (c) short circuit occurrence ratio were evaluated as follows. The results are shown in Table 1.

(a) Conduction Resistance

The conduction resistance between electrodes of front and back surfaces of the multilayer substrate was measured at a current of 1 mA using a digital multimeter (34401A, Agilent Technologies) by a four probe method. A case where the measured resistance value was 5Ω or less was determined to be OK, and a case where the measured resistance value was more than 5Ω was determined to be NG.

(b) Conduction Reliability

The multilayer substrate was left in a constant temperature bath of a temperature of 85° C. and a humidity of 85% RH for 500 hours, and the conduction resistance was then measured in the same manner as in measurement of (a). A case where the conduction resistance value was 10Ω or less was determined to be OK, and a case where the conduction resistance value was more than 10Ω was determined to be NG.

(c) Short Circuit Occurrence Ratio

The laminated semiconductor substrates were separated into each semiconductor substrate. Whether short circuit occurred between the adjacent electrodes by the conductive particles was confirmed. A case where short circuit did not occur was determined to be OK, and a case where even a single short circuit occurred was determined to be NG.

TABLE 1

|  | Com. Ex. 1 | Ex. 1 | Ex. 2 | Ex. 3 |
| --- | --- | --- | --- | --- |
| Number of Laminated Semiconductor Substrate | 3 | 3 | 4 | 3 |
| Particle Diameter (μm) | 20 | 20 | 20 | 10 |
| Conduction Resistance | NG | OK | OK | OK |
| Conduction Reliability (85° C., 85% RH, 500 hr) | NG | OK | OK | OK |
| Short Circuit Occurrence Ratio | OK | OK | OK | OK |

As seen from Table 1, in Comparative Example 1 in which the first and second semiconductor substrates were connected using the anisotropic conductive film in which the conductive particles were randomly dispersed, the conduction resistance and the conduction reliability were inferior. In Examples 1 to 3 in which the conductive particles were selectively disposed so as to correspond to the electrode arrangement, the conduction resistance, the conduction reliability, and the short circuit occurrence ratio were all favorable.

In Example 3, three conductive particles 11 were disposed inside each through electrode 4. Therefore, a margin can be secured for positioning of the anisotropic conductive film and the semiconductor substrate.

Examples 4 to 11

In Examples 4 to 7, anisotropic conductive films were manufactured by repeating the same operation as in Example 1 except that gold/nickel-coated resin particles having an average particle diameter shown in Table 2 (Micropearl, SEKISUI CHEMICAL CO., LTD.) were used as conductive particles, the number of the conductive particles per electrode, the arrangement of the conductive particles relative to the electrode, and the closest distance between the conductive particles were changed as shown in Table 2, and the conductive particles and the electrodes were directly positioned in accordance with the arrangement of the conductive particles without forming an alignment mark and films were bonded in Example 1. Multilayer substrates were manufactured using the anisotropic conductive films, and evaluated. As a result, the conduction resistance, the conduction reliability, and the short circuit occurrence ratio in all Examples 4 to 7 were favorable. In Examples 5, 7, and 9, the conductive particles were not arranged so as to correspond to the alignment mark, but the conductive particles were present on the circumferences of the electrodes. Therefore, the allowable range of shifting at the step of bonding films can be expanded.

In Examples 8 to 11, the same operation as in Examples 4 to 7 was repeated except that the outline of each through electrode 4 constituting electrodes in a peripheral arrangement of a semiconductor substrate (pitch: 85 µm, 280 pins) was changed from a circle with a diameter of 30 µm to a rectangle of 30 µm×50 µm (arrangement direction of electrode: 30 µm). As a result, the conduction resistance, the conduction reliability, and the short circuit occurrence ratio in all Examples 8 to 11 were favorable.

TABLE 2

Figure 8A:
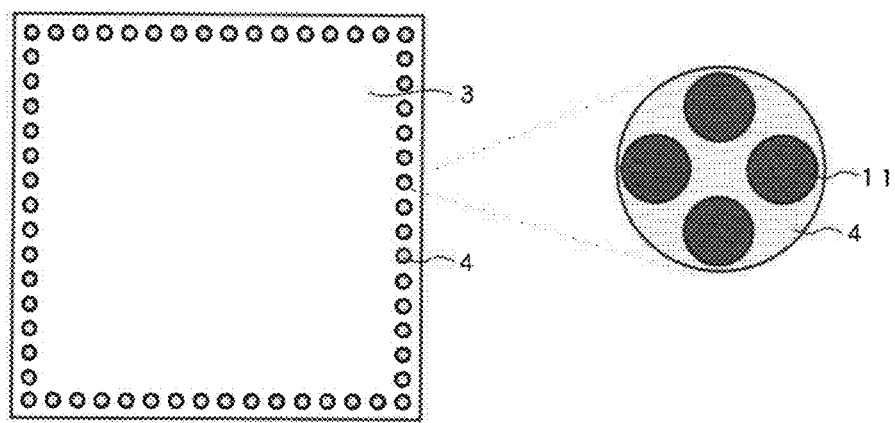
FIG. 8A is an arrangement view of electrodes and conductive particles in a surface of a semiconductor substrate used in manufacturing of a multilayer substrate of Example 4.
Figure 8B:
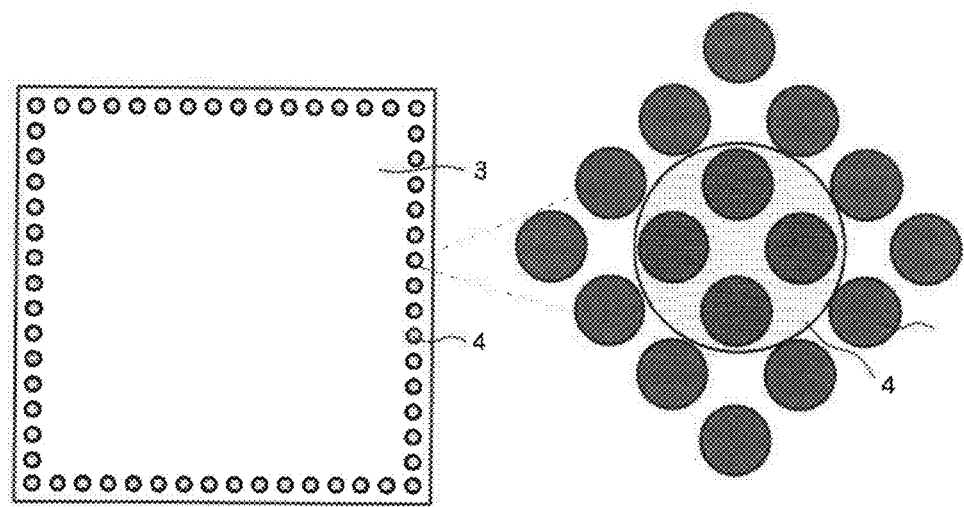
FIG. 8B is an arrangement view of electrodes and conductive particles in a surface of a semiconductor substrate used in manufacturing of a multilayer substrate of Example 5.
Figure 8C:
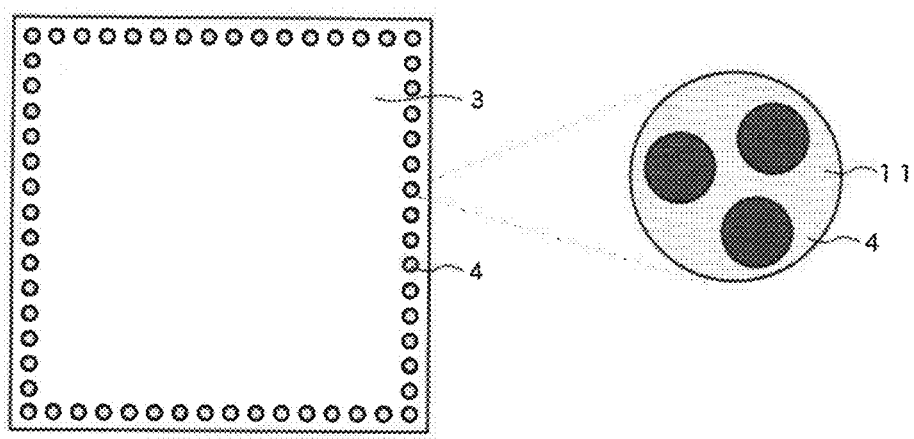
FIG. 8C is an arrangement view of electrodes and conductive particles in a surface of a semiconductor substrate used in manufacturing of a multilayer substrate of Example 6.
Figure 8D:
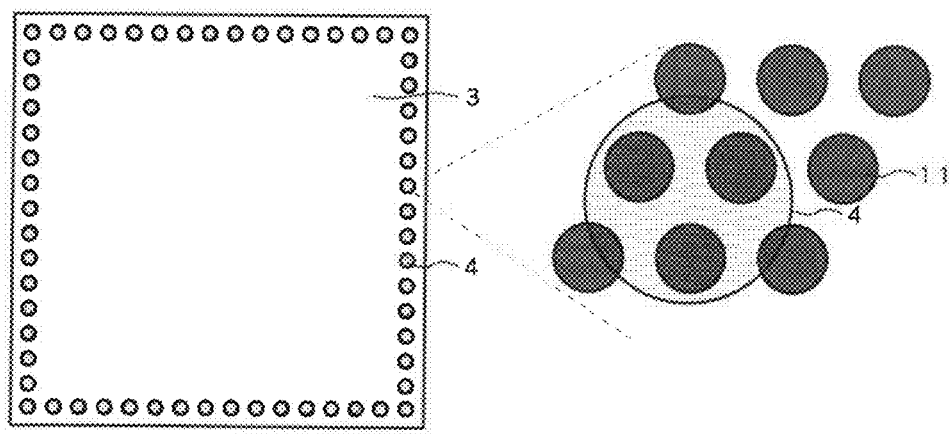
FIG. 8D is an arrangement view of electrodes and conductive particles in a surface of a semiconductor substrate used in manufacturing of a multilayer substrate of Example 7.
Figure 8E:
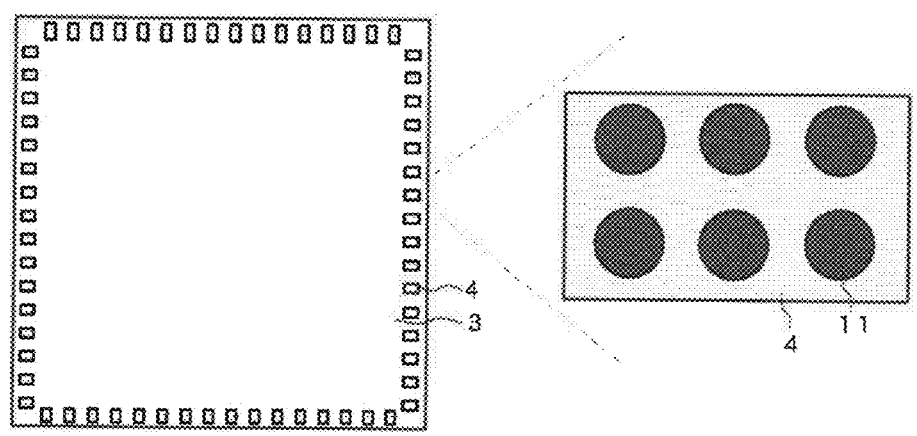
FIG. 8E is an arrangement view of electrodes and conductive particles in a surface of a semiconductor substrate used in manufacturing of a multilayer substrate of Example 8.
Figure 8F:
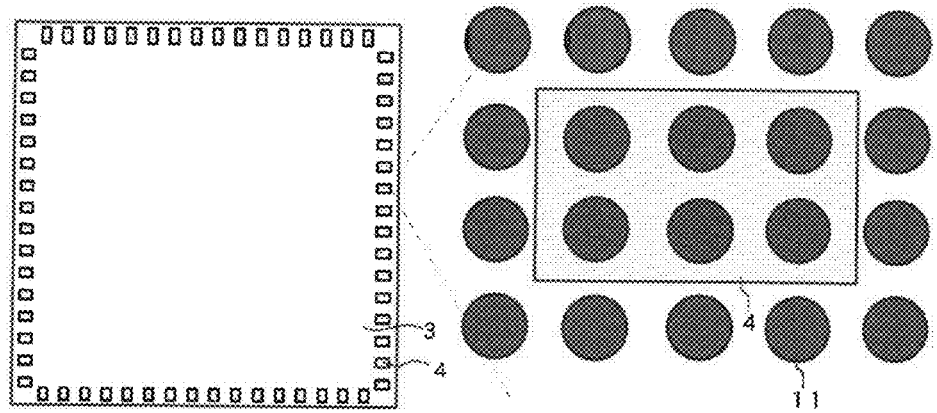
FIG. 8F is an arrangement view of electrodes and conductive particles in a surface of a semiconductor substrate used in manufacturing of a multilayer substrate of Example 9.
Figure 8G:
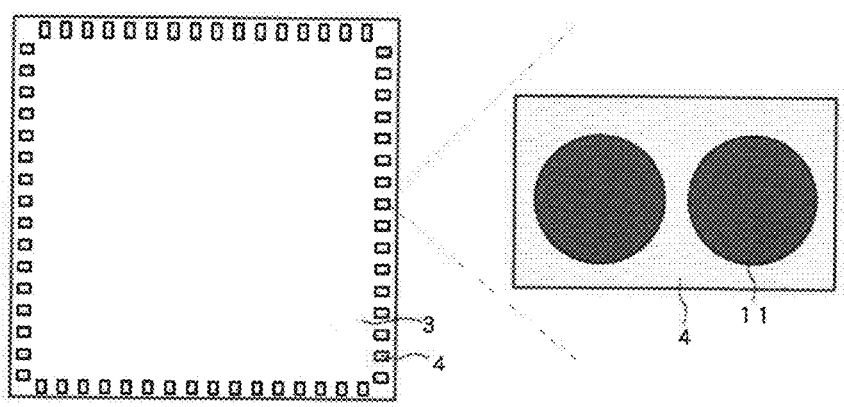
FIG. 8G is an arrangement view of electrodes and conductive particles in a surface of a semiconductor substrate used in manufacturing of a multilayer substrate of Example 10.
Figure 8H:
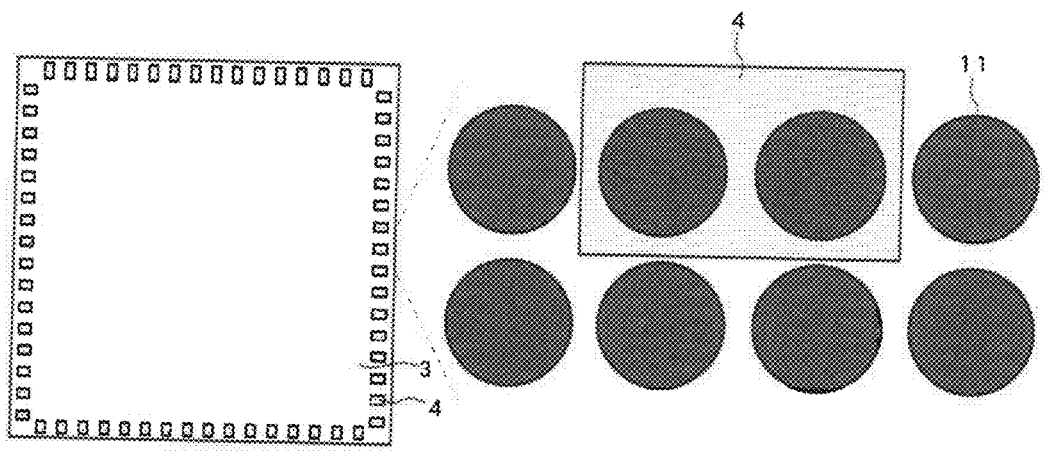
FIG. 8H is an arrangement view of electrodes and conductive particles in a surface of a semiconductor substrate used in manufacturing of a multilayer substrate of Example 11.

| | Average Particle Diameter (µm) | Number of Conductive Particles per Electrode | Arrangement of Conductive Particles Relative to Electrode | Closest Distance between Conductive Particles (µm) | Average Number Density (Particles/mm$^2$) in Semiconductor Substrate (7 mm × 7 mm) |
|---|---|---|---|---|---|
| Ex. 4 | 10 | 4 | FIG. 8A | 4.9 | 22.9 |
| Ex. 5 | 10 | 16 | FIG. 8B | 4.9 | 91.4 |
| Ex. 6 | 10 | 3 | FIG. 8C | 4.9 | 17.1 |
| Ex. 7 | 10 | 9 | FIG. 8D | 4.9 | 51.4 |
| Ex. 8 | 10 | 6 | FIG. 8E | 4.9 | 34.3 |
| Ex. 9 | 10 | 20 | FIG. 8F | 4.9 | 114.3 |
| Ex. 10 | 20 | 2 | FIG. 8G | 4.0 | 11.4 |
| Ex. 11 | 20 | 8 | FIG. 8H | 4.0 | 45.7 |

Reference Example 1

An anisotropic conductive film was manufactured by repeating the same operation as in Example 1 except that nickel-coated resin particles having an average particle diameter of 10 µm (Micropearl, SEKISUI CHEMICAL CO., LTD.) were used as conductive particles, and the arrangement of the conductive particles was changed to a tetragonal lattice with a distance between the conductive particles of 10 µm (conductive particle number density: 2,500 particles/mm$^2$) in Example 1. A multilayer substrate was manufactured using the anisotropic conductive film, and evaluated. As a result, the conduction resistance, the conduction reliability, and the short circuit occurrence ratio in all Examples were favorable.

Reference Example 2

An anisotropic conductive film was manufactured by repeating the same operation as in Example 1 except that nickel-coated resin particles having an average particle diameter of 4 µm (Micropearl AUL704, SEKISUI CHEMICAL CO., LTD.) were used as conductive particles, and the arrangement of the conductive particles was changed to a tetragonal lattice with a distance between the conductive particles of 4 µm (conductive particle number density: 16,000 particles/mm$^2$) in Example 1. A multilayer substrate was manufactured using the anisotropic conductive film, and evaluated. As a result, the conduction resistance, the conduction reliability, and the short circuit occurrence ratio in all Examples were favorable.

REFERENCE SIGNS LIST 1A, 1B, 1C, 1D multilayer substrate
2 wiring substrate
3, 3A, 3B, 3C semiconductor substrate
4, 4A, 4B, 4C, 4x through electrode
5 solder ball
6 heat sink
10A, 10B, 10D anisotropic conductive film
11, 11x conductive particle
11u conductive particle unit
12 insulating adhesive or insulating adhesive layer
L distance between conductive particles

The invention claimed is:

1. A multilayer substrate comprising semiconductor substrates which each have a through electrode and are laminated to each other, wherein
   conductive particles are each selectively present at least at a position where the through electrodes face each other as viewed in a plan view of the multilayer substrate,
   a conductive particle unit including three or more adjacent conductive particles is formed in a two-dimensional array in the plan view,
   the multilayer substrate has a connection structure in which the through electrodes are connected by the conductive particle unit, and
   the semiconductor substrates are bonded together by an insulating adhesive.

2. The multilayer substrate according to claim 1, wherein
   the semiconductor substrates include a first semiconductor substrate having a through electrode and a second semiconductor substrate having a through electrode,
   the first and second semiconductor substrates are laminated together, and
   the multilayer substrate has a connection structure in which the through electrode of the first semiconductor substrate and the through electrode of the second semiconductor substrate are connected by the conductive particle unit which is selectively disposed between the through electrodes.

3. The multilayer substrate according to claim 2, further comprising:
   a third semiconductor substrate having a through electrode laminated on the second semiconductor substrate, and having a connection structure in which the through electrode of the second semiconductor substrate and the through electrode of the third semiconductor substrate face each other, and are connected by conductive particles which are selectively disposed between the through electrodes, and the second and third semiconductor substrates are bonded by insulating adhesive.

4. The multilayer substrate according to claim 1, wherein a number of conductive particles which are not captured by the facing through electrodes between the first and second semiconductor substrates is 5% or less relative to a total number of the conductive particles present between the first and second semiconductor substrates.

5. The multilayer substrate according to claim 1, further comprising:
a heat sink in an outermost layer of the multilayer substrate that is connected to the through electrodes.

6. A method for manufacturing the multilayer substrate according to claim 1, comprising:
putting between the semiconductor substrates an anisotropic conductive film in which the conductive particles are selectively disposed in the insulating adhesive layer so as to each correspond to the position where the through electrodes face each other as viewed in the plan view of the multilayer substrate; and
pressurizing the anisotropic conductive film under heating to achieve anisotropic conductive connection of the semiconductor substrates.

7. The method according to claim 6, wherein the semiconductor substrates include a first semiconductor substrate and a second semiconductor substrate.

8. The method according to claim 7, wherein a third semiconductor substrate having a through electrode is laminated on the second semiconductor substrate, and an anisotropic conductive film in which conductive particles are selectively disposed in an insulating adhesive layer so as to correspond to an arrangement of the through electrodes is put between the through electrode of the second semiconductor substrate and the through electrode of the third semiconductor substrate, and pressurized under heating, to achieve anisotropic conductive connection between the second and third semiconductor substrates.

9. The multilayer substrate according to claim 1, further comprising an anisotropic conductive film comprising the insulating adhesive layer and the conductive particles disposed in the insulating adhesive layer, wherein the conductive particles are selectively disposed at least in the insulating adhesive layer so as to correspond to an arrangement of through electrodes connected by the anisotropic conductive film.

10. The multilayer substrate according to claim 1, wherein the conductive particles are disposed in the insulating adhesive layer.

11. The multilayer substrate according to claim 1, wherein the conductive particle unit is disposed so as to correspond to an arrangement of the through electrodes.

12. The multilayer substrate according to claim 1, wherein the conductive particles are metal-coated resin particles.

* * * * *